(12) United States Patent
Han et al.

(10) Patent No.: US 9,802,279 B2
(45) Date of Patent: Oct. 31, 2017

(54) APPARATUS AND METHOD FOR A MOLDED PLASTIC FIN SHELL FOR ELECTRONIC DEVICES

(71) Applicant: FutureWei Technologies, Inc., Plano, TX (US)

(72) Inventors: Qian Han, San Diego, CA (US); Jun Yang, Shenzhen (CN); Xiaodu Shao, Wuhan (CN)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 876 days.

(21) Appl. No.: 14/108,141

(22) Filed: Dec. 16, 2013

(65) Prior Publication Data

US 2015/0173239 A1 Jun. 18, 2015

(51) Int. Cl.
*B23P 15/26* (2006.01)
*H05K 7/20* (2006.01)

(52) U.S. Cl.
CPC .......... *B23P 15/26* (2013.01); *H05K 7/20409* (2013.01); *Y10T 29/49002* (2015.01)

(58) Field of Classification Search
CPC .. F28F 3/02; F21V 29/70; F21V 29/83; F21V 29/713; F21V 29/74; F21V 29/773; F21V 23/04; F21V 2115/10; Y10T 29/49002; G06F 1/20; G06F 1/203; G06F 1/206; H05K 5/0026; H05K 5/003; H05K 5/0034; H05K 5/0047; H05K 5/006; H05K 7/20409; B23P 15/26; H05B 33/0803; H05B 37/0272
See application file for complete search history.

(56) References Cited

U.S. PATENT DOCUMENTS

| | | | | |
|---|---|---|---|---|
| 6,735,858 B1* | 5/2004 | Schmidt | ................. | B29C 49/20 |
| | | | | 264/272.11 |
| 2004/0222517 A1* | 11/2004 | Robertson | ........... | H01L 23/4093 |
| | | | | 257/718 |
| 2011/0110107 A1* | 5/2011 | Kawato | ................... | F21S 8/026 |
| | | | | 362/373 |
| 2012/0274208 A1* | 11/2012 | Chen | ........................ | H01Q 1/38 |
| | | | | 315/34 |
| 2012/0307501 A1* | 12/2012 | Tankala | .................... | F21K 9/90 |
| | | | | 362/294 |
| 2013/0057153 A1* | 3/2013 | Kim | ......................... | F21K 9/23 |
| | | | | 315/113 |

(Continued)

*Primary Examiner* — Tho V Duong
(74) *Attorney, Agent, or Firm* — Slater Matsil, LLP

(57) ABSTRACT

Embodiments are provided for using a molded thermal plastic fin shell as part of a heat sink design for electronic devices. The heat sink design also includes metal components in contact with the electronics components of the device and the thermal plastic fin shell. The thermal plastic fin shell serves both as part of the heat sink design to dissipate heat to the air and as a protective casing or packaging for the device. The heat is transferred from the electronics components or heat sources in the device to the heat sink metal components and hence to the thermal plastic fin shell in contact with the metal. The thermal plastic fin shell dissipates the heat into the surrounding air. The combination of metal and thermal plastic materials in the heat sink design combines both desired properties of high thermal conductivity and ease of manufacture.

20 Claims, 5 Drawing Sheets

(56) References Cited

U.S. PATENT DOCUMENTS

| | | | | |
|---|---|---|---|---|
| 2013/0294085 A1* | 11/2013 | Watanabe | ......... | B29C 45/14467 |
| | | | | 362/294 |
| 2013/0329356 A1* | 12/2013 | Shanbhogue | .......... | H05K 1/144 |
| | | | | 361/679.47 |
| 2014/0247563 A1* | 9/2014 | Wang | ................. | H05K 7/20463 |
| | | | | 361/715 |

* cited by examiner

APPARATUS AND METHOD FOR A MOLDED PLASTIC FIN SHELL FOR ELECTRONIC DEVICES

TECHNICAL FIELD

The present invention relates to a heat sink design, and, in particular embodiments, to an apparatus and method for a molded plastic fin shell for electronic devices.

BACKGROUND

In electronic systems, a heat sink is a passive heat exchange component that cools down a device by dissipating heat into the surrounding medium, such as air. Heat sinks can be used with high-power semiconductor devices such as power transistors and optoelectronic devices such as lasers and light emitting diodes (LEDs), where the heat dissipation ability of the device package is insufficient to control its temperature. Heat sinks are used to cool electronic chips and can be mounted on printed circuit boards (PCBs), via some thermal interface material. A heat sink is designed to increase the surface area in contact with the cooling medium surrounding it, such as the air. Some of the factors which affect the thermal performance of a heat sink include choice of material and fin (or other protrusion) design. For many electronics devices, dissipating the heat generated within small enclosure is challenging. A heat sink design that increases the contact surface from the electronic devices to ambient air and that is easy to manufacture is needed.

SUMMARY OF THE INVENTION

In accordance with an embodiment of the disclosure, an apparatus for a heat sink for an electronics device comprises a fin shell composed of a thermal plastic material and comprising a plurality of fins across an external surface of the fin shell. The thermal plastic material has a relatively high thermal conductivity in comparison to conventional plastic materials. The apparatus further comprises a metal heat sink component, in contact with the fin shell, configured to couple to an electronics component of the electronics device. The relatively high thermal conductivity of the thermal plastic material is closer to a thermal conductivity of the metal heat sink component than to an average thermal conductivity of conventional plastic materials.

In accordance with another embodiment of the disclosure, a gateway device including heat sink components comprises an electronics component, a heat sink plate connected to the electronics component, a power supply component electrically connected to the electronics component, and a heat sink cylinder surrounding the power supply component and in contact with the heat sink plate. The gateway device further comprises a thermal plastic fin shell composed of a thermal plastic material that has substantially high thermal conductivity that is closer to a thermal conductivity range of metals than to a thermal conductivity range of conventional plastic materials.

In accordance with another embodiment of the disclosure, a method of operation of an electronics device including heat sink components includes dissipating heat from an electronics component of the electronics device to a metal heat sink component in contact with the electronics components. The method further includes dissipating the heat from the metal heat sink component to an external medium through a thermal plastic fin shell in contact with the metal heat sink component. The thermal plastic fin shell is entirely composed of a thermal plastic material that has a thermal conductivity that is closer to a thermal conductivity of the metal heat sink component than to an average thermal conductivity of conventional plastic materials.

In accordance with yet another embodiment of the disclosure, a method of manufacturing an electronics device with a heat sink includes molding a thermal plastic fin shell into a funnel-like shape. The thermal plastic fin shell has a broad end with a first diameter and a narrow end with a second diameter less than the first diameter. The method further includes forming a metal disk plate essentially from aluminum. The metal disk plate has a third diameter less than the first diameter and greater than the second diameter. The method further includes forming a metal cylinder essentially from aluminum. The metal cylinder has a fourth diameter less than the second diameter. The metal cylinder is positioned within the thermal plastic fin shell at the narrow end. The metal disk plate is positioned within the thermal plastic fin shell at the broad end and in contact with the metal cylinder. The thermal plastic fin shell is essentially composed of a thermal plastic material that has a thermal conductivity that is closer to a thermal conductivity of aluminum than to an average thermal conductivity of conventional plastic materials The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
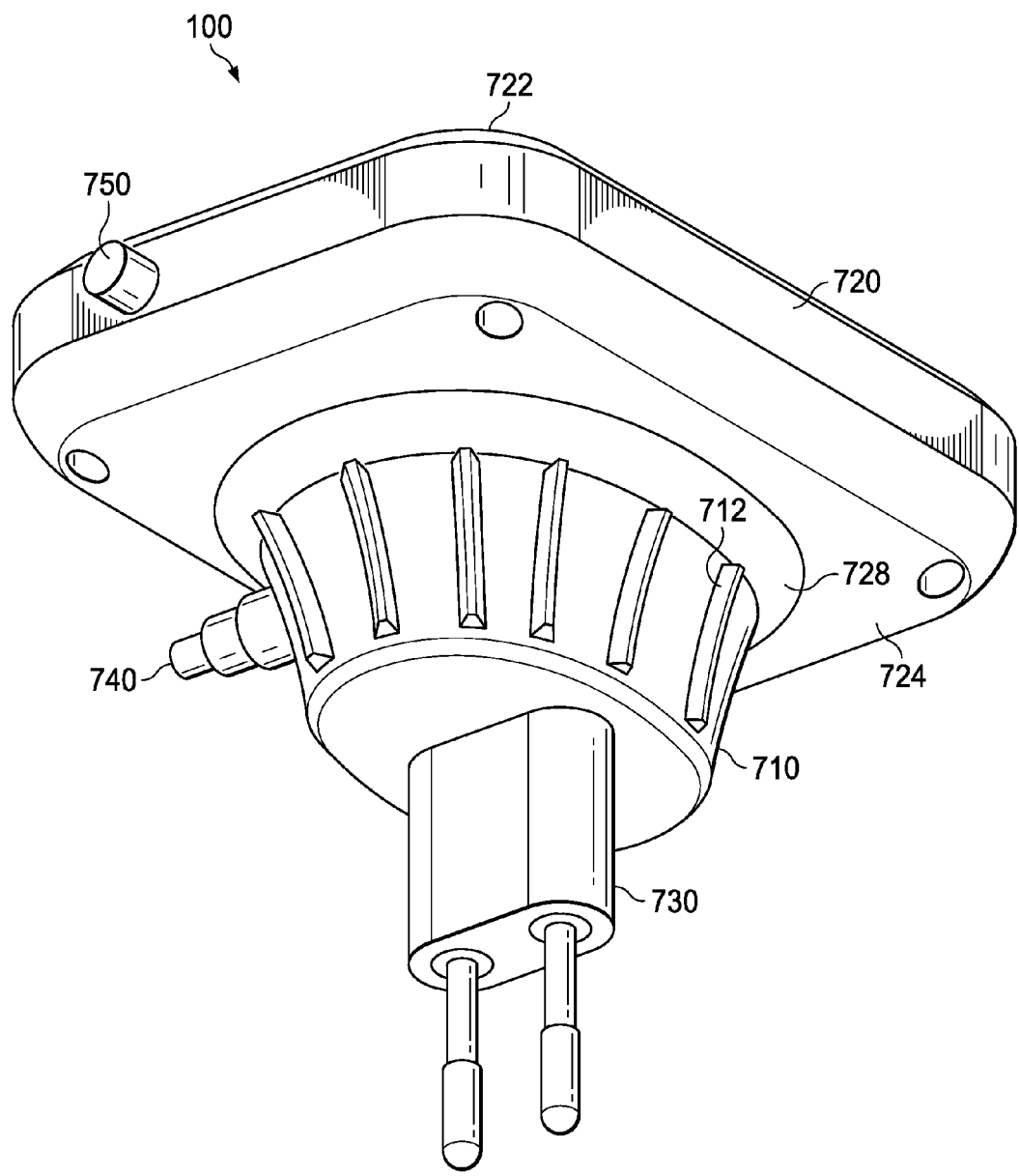
FIG. 1 illustrates an embodiment of a design for an electronic device with a molded thermal plastic fin shell component as part of a heat sink for the device.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A thermal plastic material is a type of plastic material that has higher thermal conductivity than normal or other types of plastic materials. For example, thermal plastic materials include CoolPoly™ thermally conductive plastic grades that range in thermal conductivity from about 1 W/mK to as high as 100 W/mK. Many of the thermal plastic grades have a thermal conductivity range from 1 to 20 W/mK, which is 5 to 100 times higher than the thermal conductivity of conventional plastics. The high thermal conductivity of thermal plastics makes them an option for heat sink design, although metallic materials can have higher thermal conductivity than thermal plastics.

Embodiments are provided herein for using a molded thermal plastic fin shell as part of a heat sink design for electronic devices. The heat sink design also includes metal components in contact with the electronics components of the device and the molded thermal plastic fin shell. Due to the higher thermal conductivity of metal in comparison to plastic, placing the metal in direct contact to the electronics components allows for more efficient (faster) heat dissipation from the electronics components. The heat is then transferred to the thermal plastic fin shell in contact with the metal, which in turn dissipates the heat into the surrounding air around the fin surface of the thermal plastic shell. The fin surface of the thermal plastic shell serves to increase the surface in contact with air and hence increase the heat dissipation rate. The combination of metal and thermal plastic materials in the heat sink design combines both desired properties of high thermal conductivity and ease of molding or manufacture. The molded thermal plastic fin shell serves both as part of the heat sink design to dissipate heat to the air and as a protective casing or packaging for the device. As used herein, the term thermal plastic refers to any currently or future engineered plastic material or polymer for this purpose or any conventional plastic material that has relatively high thermal conductivity sufficient for efficient heat dissipation in combination with metal plates/components.

The thermal plastic fin shell is used to cover at least a portion of the electronic components of the device, as described below. The thermal plastic fin shell is designed to increase the device contact surface with the surrounding air (for cooling), allowing faster and more efficient dissipation of the heat generated by the electronics encased by the thermal plastic fin shell. The fin shell is made of highly thermal conductive plastic (e.g., in comparison to normal plastic materials) and can be easily molded to any desired shape. For example, the thermal plastic material for forming the fin shell can have 10 times higher thermal conductivity than normal plastic materials. Additionally, the plastic material of the molded fin shell is an electric insulator and hence does not affect the electronic performance of the electronic device. For instance, in the case of an antenna device (e.g., for communicating wireless or radio signals), the antenna or radio frequency (RF) performance is not affected by the thermal plastic fin shell surrounding at least a portion of the electronic components.

Compared to a heat sink design solely based metal plates and/or metal fin structures, using a plastic fin shell reduces weight, simplifies manufacture, and reduces cost. Since the molded thermal plastic fin shell is part of the device packaging and the heat sink apparatus, the form factor for electronic devices using the thermal plastic fin plate design can be smaller and lighter than other devices that use typical heat sink designs, e.g., with metal counterparts. The heat can be easily dissipated to the large contact surface with ambient air, as described above, without the need to use a fan. This adds another advantage of avoiding noise due to using a fan, resulting in a more reliable and user friendly operation.

FIG. 1 shows an embodiment of a design for an electronic device 100 with a molded thermal plastic fin shell component as part of a heat sink for the device. The electronic device 100 can be a gateway device or a wireless communications device (e.g., cordless gateway), such as a wireless router (e.g., a WLAN or WiFi device). The wireless communications device includes an antenna or RF circuit in a chip or printed circuit board (PCB), in addition to other components such as power and processing electronics. In another embodiment, the device 100 can be a computer processing system, such as a desktop computer, a video game console, a set-top box, a digital music player, or a storage device. The device 100 includes a thermal plastic fin shell 710 that serves as a casing for the device 100 covering at least a portion of the electronics components within (not shown). The fin shell 710 includes the fins 712 extending in parallel along the external surface of the thermal plastic fin shell 710 between two opposite ends of the thermal plastic fin shell 710. The fins 712 can be molded as part of the molding process of the entire thermal plastic fin shell 710. The thermal plastic fin shell 710 may have a funnel-like shape (as shown in FIG. 1) or any other suitable shape, for example a conical or cylindrical shape.

The device 100 also includes one or more other casing parts covering internal components of the device 100, including the electronics and possibly parts of the thermal plastic fin shell 710. For instance, the casing parts include a middle casing part 720 around the electronics (e.g., around the PCB) and positioned on one end (e.g., a top end) of the thermal plastic fin shell 710, which may be opened. The casing parts also include a top casing part 722, on the middle casing part 720, covering the electronics inside the device 100. The casing parts also include a bottom casing part 724 around and covering a portion of the thermal plastic fin shell 710 (e.g., around the top end of the shell 710 facing the middle casing part 720). An annular or ring part 728 may also be placed around the thermal plastic fin shell 710 at an end of the bottom casing part 724 as shown. In other embodiments, some of the parts above may be joined as one part, such as the bottom casing part 724 and the middle casing part 720, or the middle casing part 720 and the top casing part 722. The casing parts may be made from any suitable materials, for example plastic, thermal plastic, or other.

A power plug 730 is coupled to another end of the thermal plastic fin shell 710 (e.g., a bottom end), which may be closed (as shown), opposite to the casing parts above. The power plug 730 connects to the electric components (not shown) within the device 100 through the thermal plastic fin shell 710. In another embodiment, the device 100 includes, instead of the power plug 730, a power cable that connects the electronic components, through the end of the thermal plastic fin shell 710, to a power plug. A connector or port 740 is also positioned at a side of the middle casing part 720 (as shown), at the top casing part 722, or any of the casing parts. The connector or port 740 provides primarily an external data connection/link (e.g., from another device) with the electronic components (not shown) within the device 100. For example, the connector or port 740 may be a USB connector/port or other data connector/port type. Other embodiments of the device 100 may not include the data cable or connector 740, and data communications of the device 100 may be entirely wireless communications. The device 100 also includes a switch 750 for turning the device ON/OFF. As shown, the switch 750 is placed at a side of the middle casing part 720. Alternatively, the switch 750 is placed at any suitable position that does not hinder the heat dissipation efficiency of the device 100, such as the top casing part 722.

Figure 2:
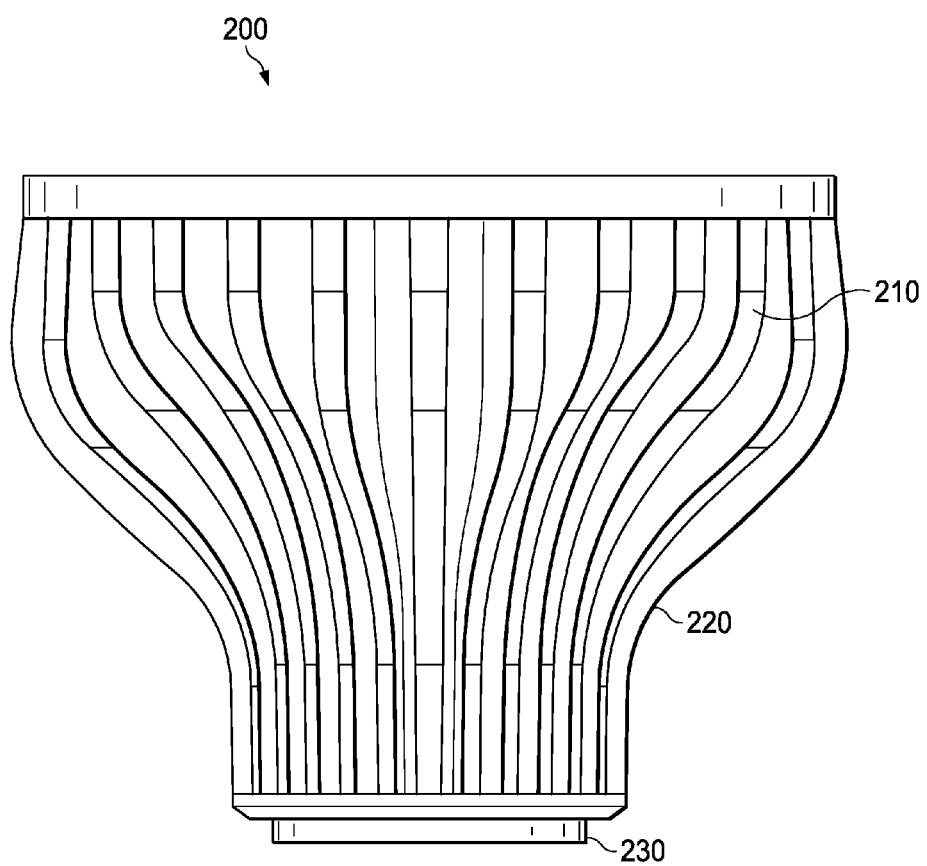
FIG. 2 illustrates an embodiment of a thermal plastic fin shell design as part of a heat sink for an electronic device.

FIG. 2 shows an embodiment of a thermal plastic fin shell 200 that can be used as part of a heat sink for an electronic device. The thermal plastic fin shell 200 can be part of the electronic device 100, corresponding to the thermal plastic fin shell 710, for example. The thermal plastic fin shell 200 can be manufactured via a suitable plastic molding process, e.g., using a cast of the design. The thermal plastic fin shell 200 has a funnel-like form as shown in FIG. 2 with three cylindrical or conical regions including a broad region 210, a middle region 220, and a narrow region 230. The fins are disposed along the circumference of the shell, across the three regions, and extended radially outwards, as shown. The broad region 210 may be open from the broad (or top) end of the shell 200 (e.g., at a top end of the device) and surrounds the electronics components of the device (not shown), e.g., a PCB or chip. The electronics component may be in direct contact to a heat sink metal plate also surrounded by the broad region 210. The middle region 220 surrounds other components of the device and heat sink, such as a cylindrical metal part of the heat sink that extends from the metal plate adjacent to the electronics components. The metal plate and cylindrical metal part can be essentially composed of aluminum, for example, which has a relatively high conductivity. As used herein, the term essentially means that a component (a heat sink metal part) may also include trace materials in relatively smaller quantities than the main composition material (aluminum). The trace materials may be unintentionally added to the final composition, such as impurities in the raw materials which are part of the composition. At least a portion of metal heat sink components (e.g., the cylindrical metal part) is placed in direct contact (without air gap) to the inner surface of the middle region 32 to ensure efficient heat dissipation through the shell 200 to external air. The narrow region 230 surrounds power extension components, another portion of the metal heat sink component (e.g., the cylindrical metal part), and possibly other device components. The narrow region 230 includes at the narrow (or bottom) end of the shell 200 an opening (e.g., a slot) that allows a power extension, e.g., a power plug or cable, to extend from the electronics inside the device and the shell 200 to outside the shell 200.

Figure 3:
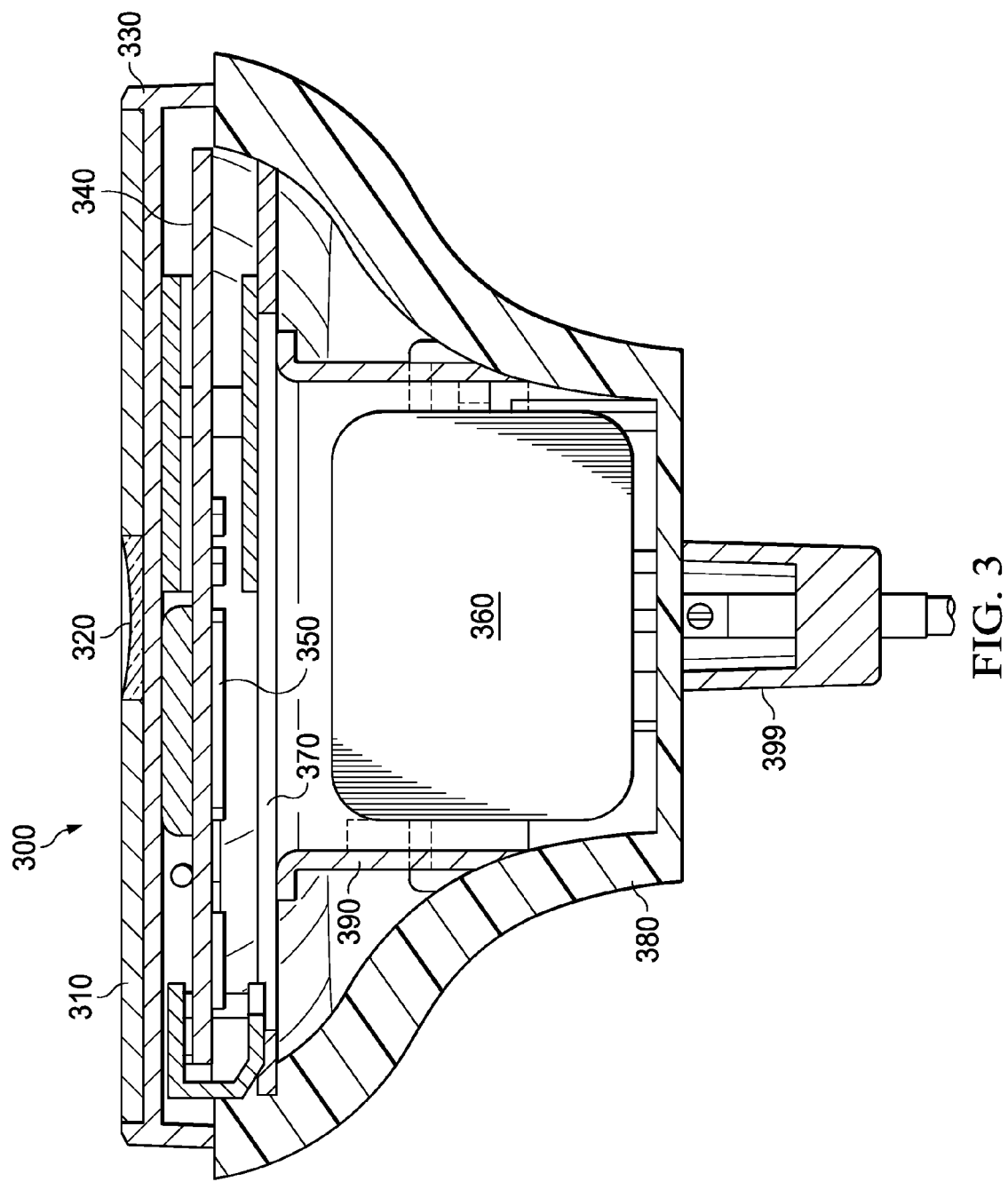
FIG. 3 illustrates an embodiment of an apparatus of an electronic device with a thermal plastic fin shell as part of a heat sink.

FIG. 3 shows an embodiment of an apparatus 300 of an electronic device with a thermal plastic fin shell as part of a heat sink. The components of the device are shown at a vertical cross section across the device and the thermal plastic fin shell. The components of the apparatus 300 shown in this side view profile of the device may correspond to the components of the device 100. The apparatus 300 also includes a plastic heat sink cover 380 which is part of the heat sink design. The plastic heat sink cover 380 is molded from thermal plastic and has a fin shell shape, as described above, or similar variations. The heat sink design also includes a heat sink plate 370, e.g., an aluminum heat sink component, directly in contact with internal walls or surface of the plastic heat sink cover 380 at the top or wide end of the plastic heat sink cover 380. A PCB 340 including electronics 350 (e.g., circuit/chip components), which form a heat source in the device, is placed on top of the heat sink plate 370. Thus, heat can be dissipated from the heat source through the heat sink plate 370 and the plastic heat sink 380 to surrounding air. A cover 330 of plastic, thermal plastic, another insulator, or other material (perhaps aluminum) is placed on the PCB 340. The cover 330 can include a button 320 for switching the device on/off and a light indicator 310 (e.g., LED) to indicate the operation mode of the device.

Additionally, the apparatus 300 includes a power supply/control unit 360 (e.g., an AC-DC unit) placed under the heat sink plate 370 within the plastic heat sink cover 380. The power supply/control unit 360 is also a heat source in the device. A heat sink cylinder 390, e.g., an aluminum heat sink component, is positioned between the power supply/control unit 360 and the plastic heat sink cover 380. The heat sink cylinder 390 is part of the heat sink design directly in contact with internal walls or surface of the plastic heat sink cover 380 at the bottom or narrow end of the plastic heat sink cover 380. Thus, heat can be dissipated from the power supply/control unit 360 through the heat sink cylinder 390 and the plastic heat sink 380, to surrounding air. The heat sink cylinder 390 can also be in direct contact with the heat sink plate 370. Thus, heat can also be dissipated from the electronics 350/PCB 340 through the heat sink plate 370, the heat sink cylinder 390, and the plastic heat sink 380 to surrounding air. A power cable 399 extends from the power supply/control unit 360 through the bottom end of the plastic heat sink 380.

Figure 4:
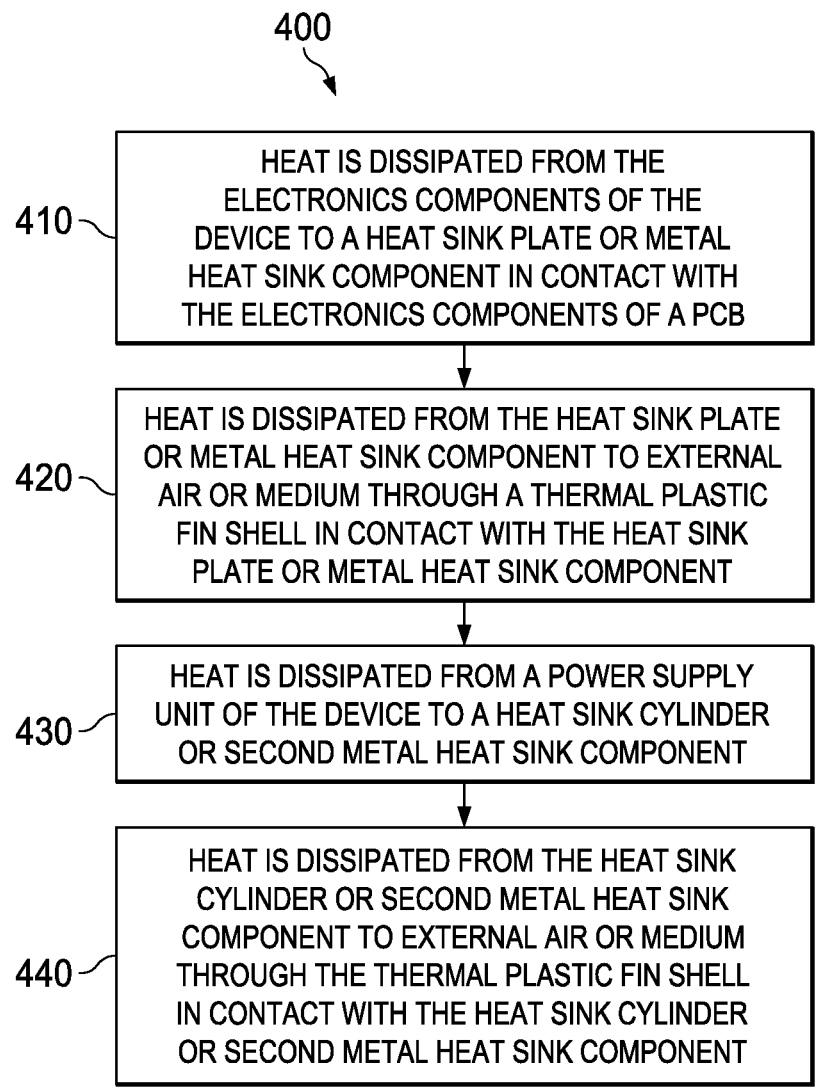
FIG. 4 illustrates an embodiment of a method of operation of a heat sink comprising a thermal plastic fin shell for an electronic device.

FIG. 4 shows an embodiment of a method 400 of operation of a heat sink comprising a thermal plastic fin shell for an electronic device. At step 410, heat is dissipated from the electronics components of the device to a heat sink plate or metal heat sink component in contact with the electronics components of a PCB. At step 420, heat is dissipated from the heat sink plate or metal heat sink component to external air or medium through a thermal plastic fin shell in contact with the heat sink plate or metal heat sink component. At step 430, heat is dissipated from a power supply unit of the device to a heat sink cylinder or second metal heat sink component. At step 440, heat is dissipated from the heat sink cylinder or second metal heat sink component to external air or medium through the thermal plastic fin shell in contact with the heat sink cylinder or second metal heat sink component. The steps are ongoing as the electronics components and the power supply unit generate heat during the operation of the device.

Figure 5:
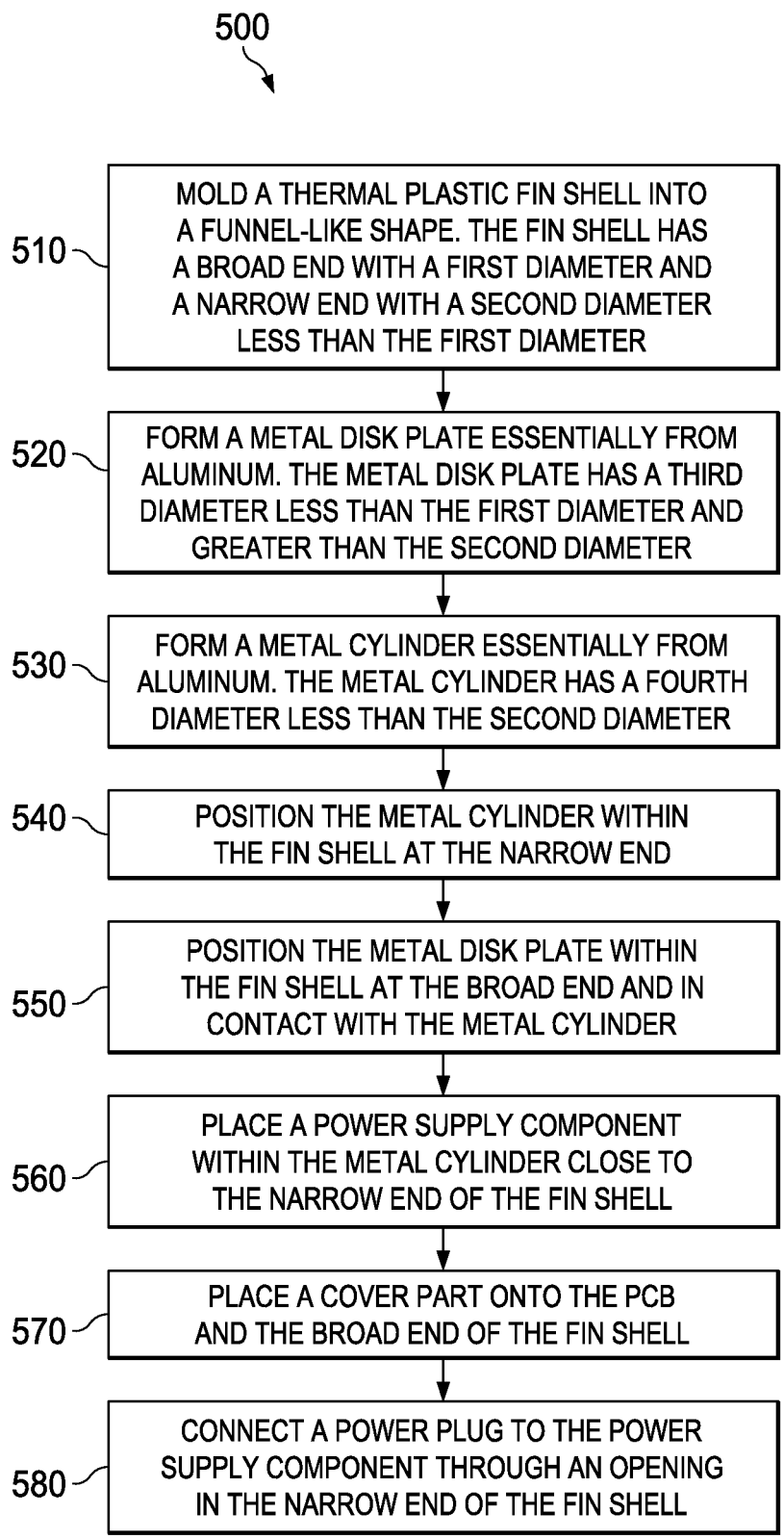
FIG. 5 illustrates an embodiment of a method for manufacturing an electronics device with a heat sink.

FIG. 5 shows an embodiment of a method 500 for manufacturing an electronics device with a heat sink, such as the apparatus 300 or the electronics device 100. At step 510, a thermal plastic fin shell is molded into a funnel-like shape. The fin shell has a broad end with a first diameter and a narrow end with a second diameter less than the first diameter. At step 520, a metal disk plate essentially from aluminum is formed. The metal disk plate has a third diameter less than the first diameter and greater than the second diameter. This step can be achieved by cutting a plate of aluminum into a disk. At step 530, a metal cylinder essentially from aluminum is formed. The metal cylinder has a fourth diameter less than the second diameter. This step can be achieved by cutting a block of aluminum into a cylinder. At step 540, the metal cylinder is positioned within the fin shell at the narrow end. At step 550, the metal disk plate is positioned within the fin shell at the broad end and in contact with the metal cylinder. At step 560, a power supply component is placed within the metal cylinder close to the narrow end of the fin shell. At step 570, a cover part is placed onto the PCB and the broad end of the fin shell. At step 580, a power plug is connected to the power supply component through an opening in the narrow end of the fin shell.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A gateway device including heat sink components, the gateway device comprising:
    a printed circuit board (PCB);
    a heat sink plate connected to the PCB;
    a radio frequency (RF) circuit component mounted on the PCB, the RF circuit component disposed between the PCB and the heat sink plate;
    a power supply component electrically connected to the RF circuit component;
    a heat sink cylinder surrounding the power supply component and in contact with the heat sink plate;
    a thermal plastic fin shell composed of a thermal plastic material, the thermal plastic fin shell surrounding and in contact with each of the heat sink plate and the heat sink cylinder; and
    a data port disposed on the thermal plastic fin shell.

2. The gateway device of claim 1 further comprising an antenna mounted on the PCB.

3. The gateway device of claim 1, wherein the heat sink plate and the heat sink cylinder each consists essentially of aluminum.

4. The gateway device of claim 1 further comprising at least one casing part in contact with the thermal plastic fin shell and covering the PCB and the heat sink plate.

5. The gateway device of claim 4 further comprising an ON and OFF light indicator positioned on the casing part.

6. The gateway device of claim 1 further comprising a power plug electrically connected to the power supply component through an opening at an end of the thermal plastic fin shell.

7. The gateway device of claim 1, wherein the thermal plastic fin shell has a funnel-like shape including a broad region surrounding the heat sink plate and a narrow region surrounding the heat sink cylinder.

8. The gateway device of claim 1, wherein the thermal plastic fin shell has a cylindrical shape surrounding the heat sink plate and the heat sink cylinder.

9. The gateway device of claim 1, wherein fins of the thermal plastic fin shell are disposed along a circumference of the thermal plastic fin shell and extended radially outwards.

10. The gateway device of claim 1, the thermal plastic fin shell having a thermal conductivity between 1 W/mK and 100 W/mK.

11. The gateway device of claim 10, the thermal conductivity of the thermal plastic fin shell being between 1 W/mK and 20 W/mK.

12. A method of operation of an electronics device including heat sink components, the method comprising:
    dissipating heat from a radio frequency (RF) circuit component mounted on a printed circuit board (PCB) of the electronics device to a metal heat sink plate in contact with the PCB, the RF circuit component disposed between the PCB and the metal heat sink plate;
    dissipating heat from a power supply component of the electronics device to a metal heat sink cylinder surrounding the power supply component and in contact with the metal heat sink plate;
    dissipating the heat from the metal heat sink plate and the metal heat sink cylinder to an external medium through a thermal plastic fin shell surrounding and in contact with the metal heat sink plate and the metal heat sink cylinder; and
    communicating with an external electronics device via a data port positioned on the thermal plastic fin shell.

13. The method of claim 12, further comprising dissipating heat from the metal heat sink plate to the metal heat sink cylinder.

14. The method of claim 12, wherein the metal heat sink plate and the metal heat sink cylinder each consists essentially of aluminum.

15. The method of claim 12, wherein the thermal plastic fin shell has a funnel-like shape including a broad region surrounding the metal heat sink plate and a narrow region surrounding the metal heat sink cylinder.

16. The method of claim 12, wherein the thermal plastic fin shell has a cylindrical shape surrounding the metal heat sink plate and the metal heat sink cylinder.

17. The method of claim 12, the thermal plastic fin shell composed of a thermal plastic material having a thermal conductivity between 1 W/mK and 100 W/mK.

18. The method of claim 17, the thermal conductivity of the thermal plastic material being between 1 W/mK and 20 W/mK.

19. A gateway device including heat sink components, the gateway device comprising:
    a printed circuit board (PCB);
    a heat sink plate connected to the PCB;
    an radio frequency (RF) circuit component mounted on the PCB, the RF circuit component disposed between the PCB and the heat sink plate;
    a power supply component electrically connected to the RF circuit component;
    a heat sink cylinder surrounding the power supply component and in contact with the heat sink plate;
    a thermal plastic fin shell composed of a thermal plastic material, the thermal plastic fin shell surrounding and in contact with each of the heat sink plate and the heat sink cylinder;
    at least one casing part in contact with the thermal plastic fin shell and covering the PCB and the heat sink plate; and
    an ON and OFF switch positioned on the casing part.

20. A method of operation of an electronics device including heat sink components, the method comprising:
- dissipating heat from a radio frequency (RF) circuit component mounted on a printed circuit board (PCB) of the electronics device to a metal heat sink plate in contact with the PCB, the RF circuit component disposed between the PCB and the metal heat sink plate;
- dissipating heat from a power supply component of the electronics device to a metal heat sink cylinder surrounding the power supply component and in contact with the metal heat sink plate;
- dissipating the heat from the metal heat sink plate and the metal heat sink cylinder to an external medium through a thermal plastic fin shell surrounding and in contact with the metal heat sink plate and the metal heat sink cylinder; and
- indicating an operation status of the electronics device via an ON and OFF light positioned on a casing, the casing in contact with the thermal plastic fin shell and covering the PCB and the metal heat sink plate.

* * * * *